United States Patent [19]
Darling, Jr.

[11] Patent Number: 5,268,062
[45] Date of Patent: * Dec. 7, 1993

[54] METHOD AND APPARATUS FOR CARBON COATING AND BORON-DOPED CARBON COATING A POROUS REFRACTORY SUBSTRATE

[75] Inventor: Phillip H. Darling, Jr., Buena Park, Calif.

[73] Assignee: Northrop Corporation, Los Angeles, Calif.

[*] Notice: The portion of the term of this patent subsequent to Aug. 25, 2009 has been disclaimed.

[21] Appl. No.: 895,965

[22] Filed: Jun. 8, 1992

Related U.S. Application Data

[63] Continuation of Ser. No. 490,002, Mar. 5, 1990, Pat. No. 5,141,595.

[51] Int. Cl.$^5$ ............................................. C30B 25/06
[52] U.S. Cl. .................................. 156/610; 156/611; 156/612; 156/613; 156/614; 156/DIG. 88
[58] Field of Search ............... 156/600, 610, 611, 612, 156/613, 614, DIG. 73, DIG. 86, DIG. 88

[56] References Cited

U.S. PATENT DOCUMENTS

| | | | |
|---|---|---|---|
| 2,883,708 | 4/1959 | Sem . | |
| 3,386,866 | 6/1968 | Elbert et al. | 156/613 |
| 3,428,519 | 2/1969 | Zvanut . | |
| 3,565,683 | 2/1971 | Morelock . | |
| 4,196,159 | 4/1980 | Brotzman et al. | 264/29.1 |
| 4,341,588 | 7/1982 | Sterling | 156/601 |
| 4,533,410 | 8/1985 | Ogura et al. | 156/614 |
| 4,722,860 | 2/1988 | Doljack et al. . | |
| 4,722,911 | 2/1988 | Frijlink | 156/614 |
| 5,079,039 | 1/1992 | Heraud et al. | 427/249 |
| 5,141,595 | 8/1992 | Darling, Jr. | 156/610 |

FOREIGN PATENT DOCUMENTS

| | | |
|---|---|---|
| 0385869 | 1/1990 | European Pat. Off. . |
| 2401888 | 9/1977 | France . |

*Primary Examiner*—Robert Kunemund
*Assistant Examiner*—Felisa Garrett
*Attorney, Agent, or Firm*—Terry J. Anderson; Robert B. Block; Karl J. Hoch, Jr.

[57] ABSTRACT

A gravity assisted open system for coating porous refractory substrates with a highly uniform layer of graphite or other material. Pyrolytic dissociation of downwardly flowing precursor gases in an inert atmosphere, countercurrent to an upward direction of transport of the porous refractory substrate, promotes infiltration of dissociated species of the precursor gases into pores and cavities of the porous refractory substrate. The infiltrated species collide with and condense on the surfaces of the pores and cavities of the upwardly moving porous refractory substrate to form a homogenous coating having particular electrical, mechanical, and optical properties. The open configuration of the system allows coating of specimens of porous refractory substrate material at substantially atmospheric pressure, which reduces startup and shutdown transient conditions which affect the uniformity of the coating and its properties, and which provides for coating porous refractory substrates at production rates.

20 Claims, 7 Drawing Sheets

METHOD AND APPARATUS FOR CARBON COATING AND BORON-DOPED CARBON COATING A POROUS REFRACTORY SUBSTRATE

CROSS-REFERENCE TO RELATED APPLICATIONS

This application is a continuing application of our pending application, entitled "Method and Apparatus for Carbon Coating and Boron-Doped Carbon Coating," Ser. No. 07/490,002 filed on Mar. 5, 1990 now U.S. Pat. No. 5,141,595.

FIELD OF THE INVENTION

This invention relates to an apparatus and process for carbon-coating a porous refractory substrate, and a process for doping to enhance the semiconductor properties of the carbon coating of a porous refractory substrate in an open system operating essentially at atmospheric pressure. The invention provides a highly uniform coating on surfaces of pores and cavities of such substrates which has particular electrical, mechanical, and optical properties.

BACKGROUND OF THE INVENTION

Processes for carbon-coating a substrate are known and are taught, for example, in U.S. Pat. No. 3,428,519 to Zvanut. Zvanut discloses a process for thermoplastic fiber generation and carbon-coating under atmospheric pressure in an oxygen-rich, closed system.

A second example of Boron-doped carbon-coating is taught in U.S. Pat. No. 3,565,683 to Morelock. Morelock discloses a continuous process for depositing a boro-carbon coating on an electrically heated surface of a pyrolytic carbon-coated fused silica fiber as it is passed through a liquid, thermally decomposable boron compound.

U.S. Pat. No. 4,722,860 to Doljack et al. discloses a method for forming a flexible carbon-coated, electrically conductive cloth. An organic compound is pyrolytically coated onto a refractory, fibrous cloth under an inert atmosphere, in a closed system. The use of a vacuum is disclosed as a means for mobilizing organic precursor compounds.

Processes for carbon densification of porous refractory materials are also known.

U.S. Pat. No. 4,196,159 to Brotzman et al. discloses a method for embedding carbon in the pores of refractory masonry used in furnaces and metallurgical vessels to re-carburize the masonry and extend its useful life. A carbon carrier is infiltrated under pressure into the heated masonry from its cooler outside surfaces. As the carrier penetrates the pores, cracks, and joints of the masonry, the increasing masonry temperature causes "cracking" of the carrier and the dissociated carbon is deposited in the masonry cavities. Carbon embedding occurs unevenly and takes place preferentially in zones of higher porosity, larger cavities, cracks, and joints.

U.S. Pat. No. 2,883,708 to Sem discloses a method for manufacturing carbon electrodes which reduces the porosity of such electrodes. A hydrocarbon gas is forced through the heated electrode body so that pyrogenic decomposition of the gas occurs and carbon is precipitated on and within the body to solidify the electrode. Densification is a function of the pressure and temperature differentials across the electrode body, of the size of the electrode body, and of the amount of gas forced through it.

EPO Patent No. 0 385 869, and corresponding U.S. Pat. No. 5,079,039 to Heraud et al., disclose a method for producing a ceramic matrix composite material having improved toughness. Alternating layers of an essentially ceramic material and a less rigid material such as pyrolytic carbon or boron nitride are deposited by chemical vapor infiltration on a porous reinforcing structure of refractory fibers to densify the structure and form the ceramic matrix composite material.

French Patent 2 401 888 also to Heraud et al. discloses a porous body partly densified by vapor deposition of carbon which is further densified by infiltration with refractory materials other than carbon. The densified body so produced has higher mechanical strength in tension and compression and is more resistant to erosion and chemical attack by molten alkali metals.

SUMMARY OF THE INVENTION

In accordance with an embodiment of the present invention an apparatus and process for continuous high temperature carbon-coating of a substrate at atmospheric pressure in an open system is provided. The process comprises passing the substrate to be coated upwardly through a heated, air-free, inert gas-flushed reaction chamber that is open to the atmosphere at the bottom; and introducing a carbon containing precursor gas at the top of the reaction chamber, such that the gas flows in a downward direction, counter-current to the moving substrate; wherein the carbon containing precursor gas thermally dissociates and the carbon therefrom then condenses on the substrate as graphite. The substrate may be a flexible substrate, such as a tape formed of refractory fibers, or rigid, such as a block or tile of porous refractory material. For a flexible substrate, the coated material may be wound up and stored inside a chamber just above the reaction chamber. Alternatively, endless transport of material through the reaction chamber is provided by opening the top of the reaction chamber and providing an inert gas blanket with slight positive pressure. Thus, the coated flexible substrate may be removed without introducing air into the reaction chamber. For a rigid substrate, transportation of the coated substrate through the reaction chamber to an unloading position exterior to the chamber for further processing is provided.

In accordance with another embodiment of the present invention a semiconducting material such as boron trichloride, is introduced as a gas at the top of the aforementioned reaction chamber. The semiconducting material is then thermally dissociated along with the carbon precursor gas and condenses on the upwardly moving substrate. The result is a semiconductor-doped, carbon-coated substrate having particular electrical, magnetic, and optical properties.

DETAILED DESCRIPTION OF THE INVENTION

In accordance with the present invention, a process and apparatus for the continuous chemical vapor deposition of a superstrate onto a substrate is provided. In particular, the process allows a substrate to be coated with a graphitic material, thus affording an electrically conductive, carbon-coated product.

Figure 1:
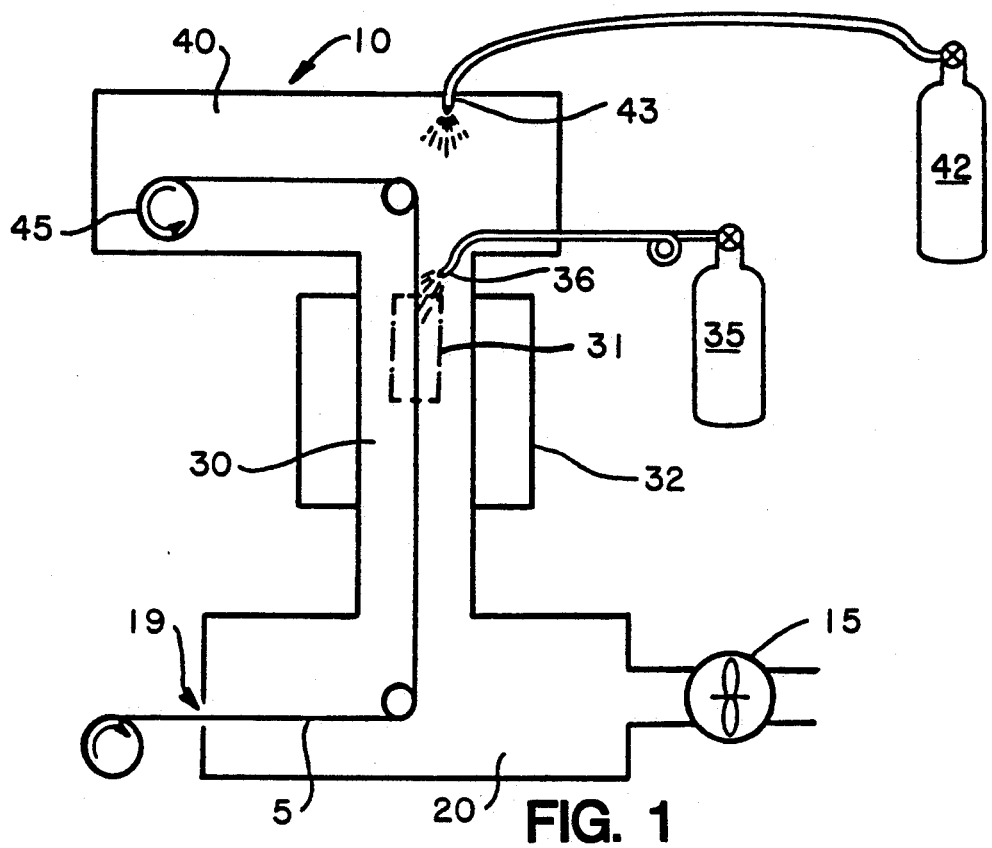
FIG. 1 is a schematic illustration of a process in accordance with one embodiment of the present invention for coating a flexible fibrous refractory substrate.

FIG. 1 shows one embodiment of the present invention. A flexible fibrous substrate material 5 to be coated is introduced through an inlet 19 of a lower chamber 20 of a process plant 10. The essential characteristic of the substrate is that it be able to survive the elevated temperature of the reaction chamber 30, typically 700°–900° C. Suitable flexible fibrous substrates include refractory fibers and cloths composed of such fibers. A description of acceptable refractory materials is found in U.S. Pat. No. 4,722,860 to Doljack et al., which is incorporated herein by reference.

The material to be coated is directed into a heated, essentially oxygen-free reaction chamber 30, where chemical vapor deposition occurs. The chamber is heated by an oven 32. It is necessary to purge all oxygen from the reaction chamber 30 in order to avoid oxidation of the precursor gases 35. This is accomplished by flushing the process plant 10 with an inert gas, such as argon or nitrogen, prior to the actual chemical vapor deposition.

In the particular apparatus shown in FIG. 1, the coating process occurs within an "open" process plant 10 comprising three chambers: a lower chamber 20, a heated reaction chamber 30, and an upper chamber 40. The interior of all three chambers, but especially the reaction chamber and the lower chamber, are preferably constructed of a strong, corrosion-resistant material. Presently, a thick-walled quartz tube is used as the reaction chamber. Anti-corrosive properties are required because highly reactive molecular, atomic, and ionic species are generated during the coating process. Some of the species can destructively interact with exposed surfaces within the apparatus, potentially resulting in a loss of structural integrity. The substrate 5 is introduced into the lower chamber 20 through an inlet 19 that is open to the surrounding atmosphere. The substrate is moved up through the reaction chamber 30 which contains chemical vapor deposition zone 31, wherein the substrate is coated with a superstrate. The coated substrate then passes into an upper chamber 40, where it is stored on a spool 45 or other appropriate take up means.

A prototype process plant has been designed to accommodate a substrate that is about four inches wide. Thus, both the width of the inlet 19 in the lower chamber 20, and the diameter of the quartz tube comprising the reaction chamber 30 are slightly larger than four inches. An example of a larger system for preliminary batch production on a larger scale will be described in greater detail subsequently. Those skilled in the art will recognize the scaling of the systems described for commercial application.

The substrate employed for prototype operations was Nextel 312 fiber having 62% aluminum oxide ($Al_2O_3$), 14% boron oxide ($B_2O_3$), 24% silicon dioxide ($SiO_2$) by weight. The fibers were woven in to a fabric of 300 denier, 5 harness satin weave, 60×60 yarns/inch.

The oven 32 preferably encompasses the entire reaction chamber, and therefore provides a thermally uniform environment within the chemical vapor deposition zone. The preferred oven operates by electrical resistivity heating and is exemplified by the 54000 series tube furnaces produced by Lindberg, 304 Hart Street, Watertown, Wis. used in the prototype.

Chemical vapor deposition is accomplished by introducing a precursor gas 35 into the top of the reaction chamber through a nozzle 36. As indicated in the drawings, the reaction chamber is vertically oriented, and thus, the gravity gradient operates from top to bottom. In addition pressure in the upper chamber 40 is elevated relative to the lower chamber 20 due to the introduction of the precursor gas 35. Accordingly, the molecules comprising the precursor gas travel in a generally downward direction, counter-current to the moving substrate. As long as either a process gas or an inert gas is introduced at the top of the reaction chamber, no air is introduced into the system through the lower chamber inlet 19. Thus, the system is "open" and is operated at substantially atmospheric pressure.

As the precursor gas moves down the heated reaction chamber, the gas is thermally dissociated into various species, such as individual atoms and molecular fragments. These species collide with and condense on the upwardly moving substrate 5, forming a superstrate coating, which is more fully described subsequently.

As discussed above, the process plant is first purged of oxygen by flushing the plant with an inert gas 42 such as argon or nitrogen. Additionally, during the coating process, a constant flow of inert gas of about 1 l/min is preferably provided at the top of the upper chamber. The gas is introduced into the upper chamber through a nozzle 43. This facilitates the even distribution of the precursor gas or gases throughout the chemical vapor deposition zone. Both precursor and inert gas flow rates may be maintained by conventional regulator means. In an alternate embodiment described below, a feedback control system is employed to monitor and control the coating process, and includes electronic control of the precursor gas flow rate.

Within the reaction chamber 30, individual precursor gas molecules are heated and thermolytically dissociated into a number of molecular, atomic and ionic species. The nature of the actual species produced depends upon a number of factors, including the temperature of the reaction chamber, and the flow rate of the precursor gas.

When dissociated species collide with the moving substrate, they lose energy and condense on the surface of the substrate. The result is a superstrate-coated substrate.

The process is particularly suitable for carbon-coating a substrate to produce an electrically conductive material. To this end, the process employs a hydrocarbon as the precursor gas. Isobutylene is a preferred hydrocarbon.

Figure 3:
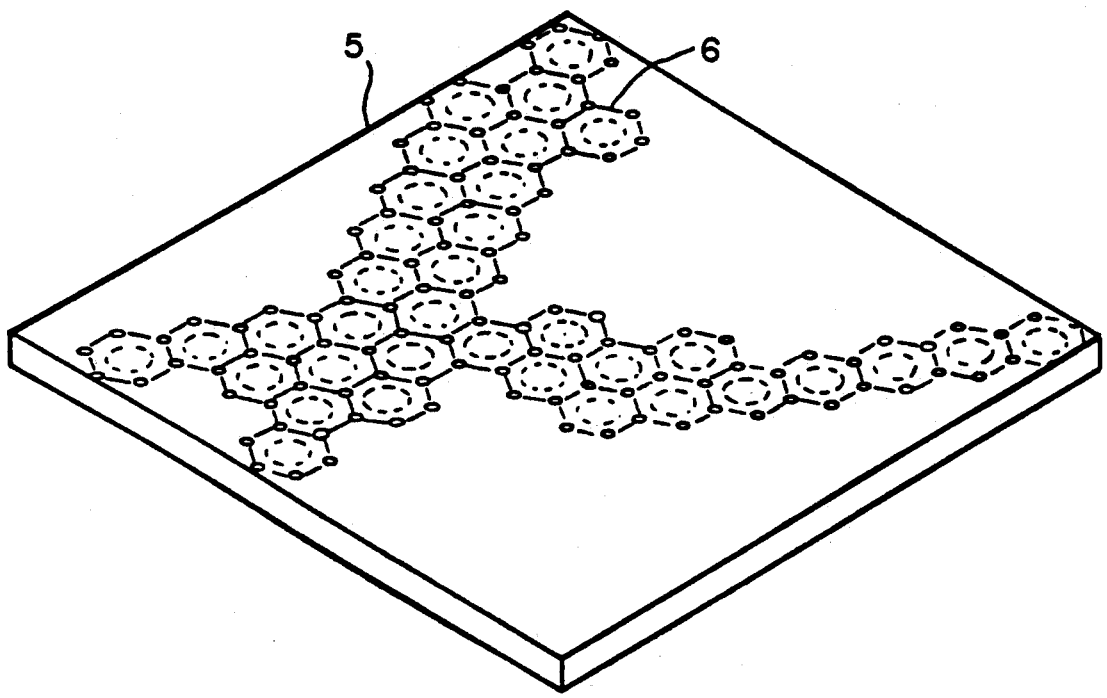
FIG. 3 is a schematic view of a graphitic superstrate deposited on a substrate by the process of the present invention.

When isobutylene is thermally dissociated, the species that are produced include hydrogen atoms and hydrocarbon radicals. As shown schematically in FIG. 3, it is thought that when the hydrocarbon radicals condense, and "stick" to the substrate 5, hexagonal "graphite-like" arrays 6 are formed. The result is an electrically conductive superstrate, or graphite coating. Micrographic analysis of substrates coated using the process and apparatus of the invention show a highly uniform, tenaciously bonded coating.

It has been discovered that the present invention is also useful as a process for boro-carbon coating a substrate. Specifically, by introducing both hydrocarbon and boron-containing gases into the reaction chamber, a superstrate that comprises boron-doped carbon arrays is formed on the substrate. The electrical properties of the coated substrate can be "fine tuned" by adjusting the hydrocarbon:boron ratio of the precursor gases. Specifically, a substrate can be coated such that the resulting product has a controllable sheet resistance along its length and a substantially uniform sheet resistance along its breadth. The feedback control system described below provides the means for such fine tuning.

Presently, it is preferred to use a blend of isobutylene and boron trichloride as the precursor gas. Because of the similar bond enthalpies of B-Cl bonds in $BCl_3$, and C-C bonds in isobutylene, a reaction chamber temperature of from about 700° C. to about 900° C. is sufficient to yield effective thermal dissociation of both boron trichloride and isobutylene. A boro-carbon coating produced in this manner has a markedly lower electrical resistance than a coating that is not boron-doped.

It will be understood by those skilled in the art that the present invention has additional applications. For example, the process can be utilized to coat a substrate with other materials. Because the process entails chemical vapor deposition, correlation between precursor gas bond strengths and reaction chamber temperature is required.

Figure 2:
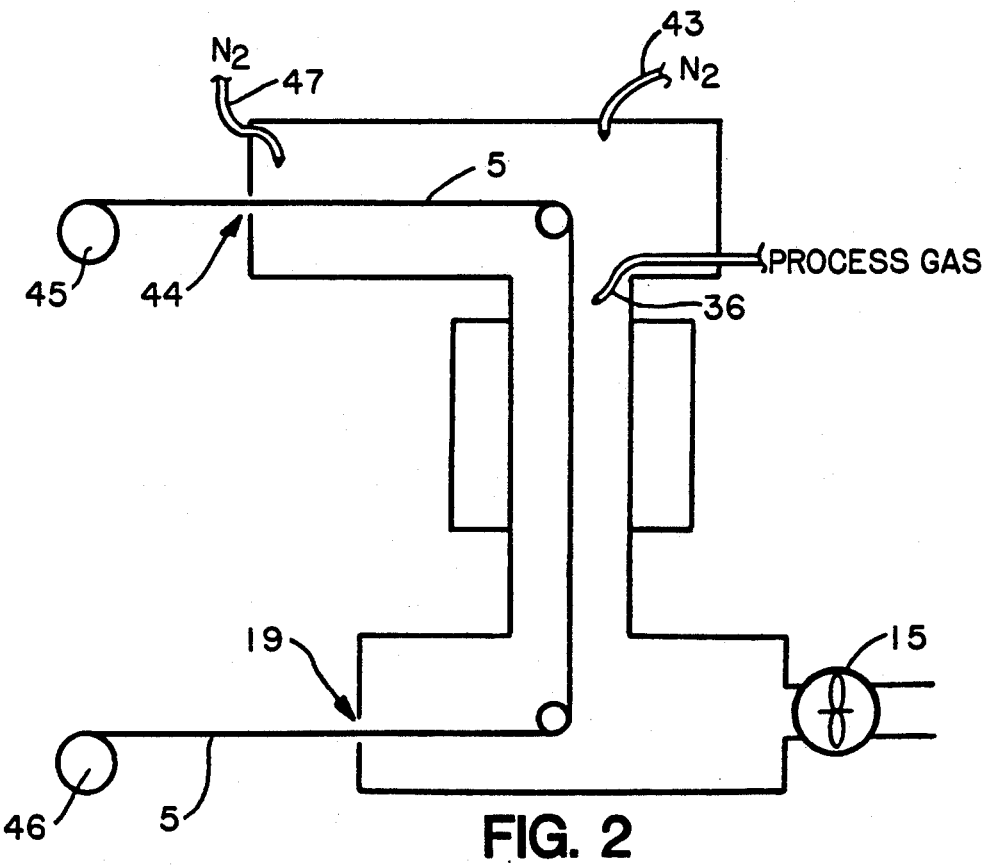
FIG. 2 is a schematic illustration of a process in accordance with an alternate embodiment of the present invention for coating a flexible fibrous refractory substrate.

The process has been described as embodying a vertically oriented system that is open at the bottom. In an alternate embodiment, the coating process is operated in a plant that is open both above and below the reaction chamber. This embodiment is schematically shown in FIG. 2.

The upper chamber 40 now contains an outlet 44, through which the coated substrate passes as it leaves the process plant. The take-up means 45 and playout means 46 are externally located in this embodiment. An additional blanket of inert gas is provided in the upper chamber through inlet 47, with gas flow directed toward the outlet 44, so that the introduction of air into the upper chamber is prevented.

When the coating process is operated in this doubly open process plant, the benefit of endless throughput of material is realized.

The process as described above can be modified to include exhaust means for removing by-products of the thermal dissociation and coating steps. The process plant depicted in FIGS. 1 and 2 includes exhaust means 15 attached to the lower chamber 20. The inflow of the precursor and inert gases is balanced against the exhaust means such that the reaction chamber is filled with gas, moving downward, and such that air cannot enter the reaction chamber. Thus, the exhaust means is adjusted to just remove reaction by-products, and the coating process operates at, or slightly above, atmospheric pressure.

In a modification of the invention described above, the coating process is monitored and controlled by a feedback control system. Essentially, the system comprises periodically measuring a physical property (or properties) of the coated substrate, and using the resulting measurements to control the chemical vapor deposition process so as to produce a coated substrate having desirable, and preferably uniform, properties.

Figure 4A:
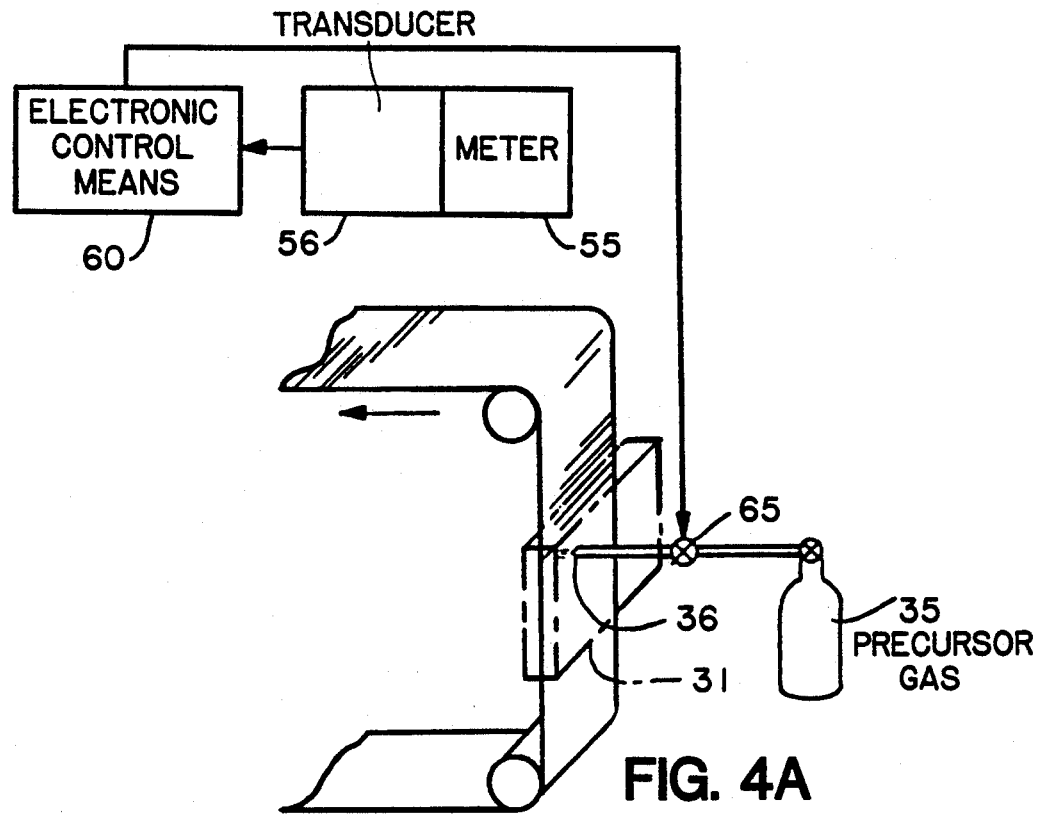
FIGS. 4A and 4B are schematic diagrams of a feedback control system used in one embodiment of the invention.
Figure 4B:
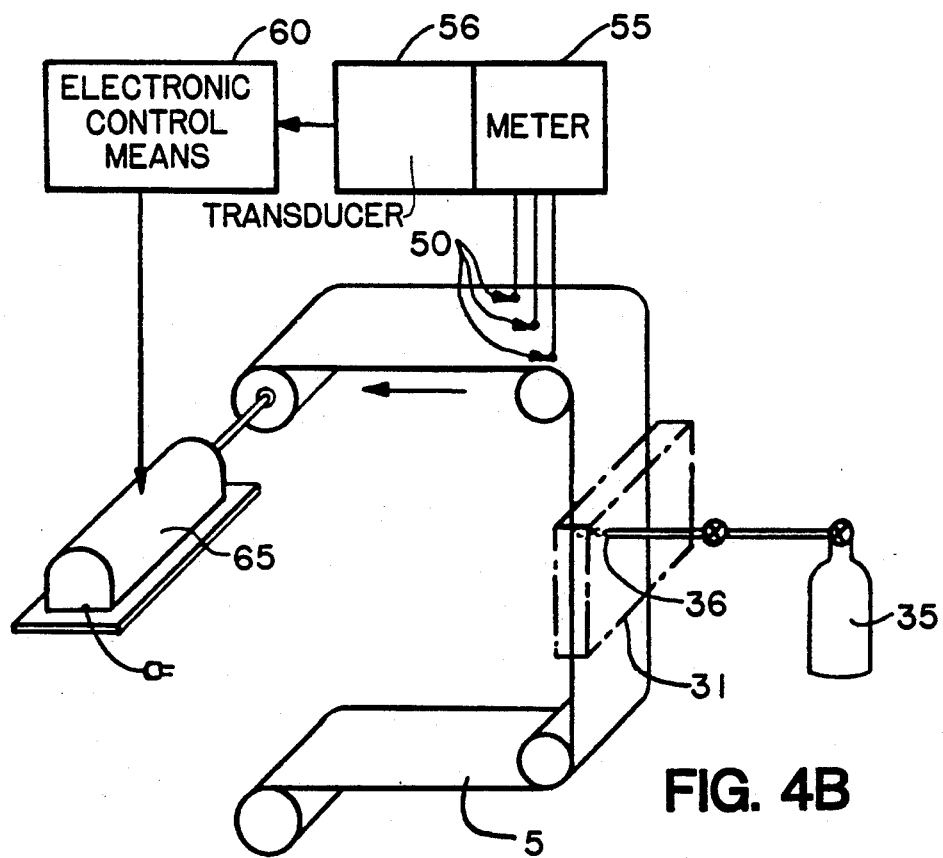

Schematic diagrams are shown in FIGS. 4A and 4B. After the moving substrate is coated with a superstrate in the chemical vapor deposition zone, a physical property of the coated substrate is measured by measuring means comprising pick-ups 50 and a meter 55. The property may be electrical (e.g. resistivity, conductivity, etc.), magnetic (e.g. magnetic susceptibility), or optical (e.g. optical density, refractive index, etc.). A combination of properties may be measured.

A transducer 56 attached to the meter converts the measured value into an electrical (or optical) signal which is input into electronic control means 60. The electronic control means is connected for physically altering a parameter such a substrate transport velocity, precursor gas flow rate, oven temperature or combinations thereof. In the preferred embodiment shown in FIG. 4B, the means for altering the parameter comprises a motor 65 that powers the transport of the substrate through the reaction chamber. When the feedback mechanism operates by regulating substrate transport velocity, very rapid adjustment of the coated substrate's properties is achieved.

Alternatively, the means for altering the parameters may comprise a valve that regulates precursor gas flow rate as shown in FIG. 4A, or a thermostat that regulates oven temperature. A combination of the means for altering the parameters described previously may be employed.

The value of a given property of the coated substrate depends upon the physico-chemical make-up of the superstrate coating. Altering the conditions within the chemical vapor deposition zone by adjusting a parameter such as substrate transport velocity, flow rate or oven temperature results in a modification of the properties of the coated substrate. Thus, the described feedback mechanism provides a means for maintaining the value of superstrate properties within desirable tolerances.

Figure 5:
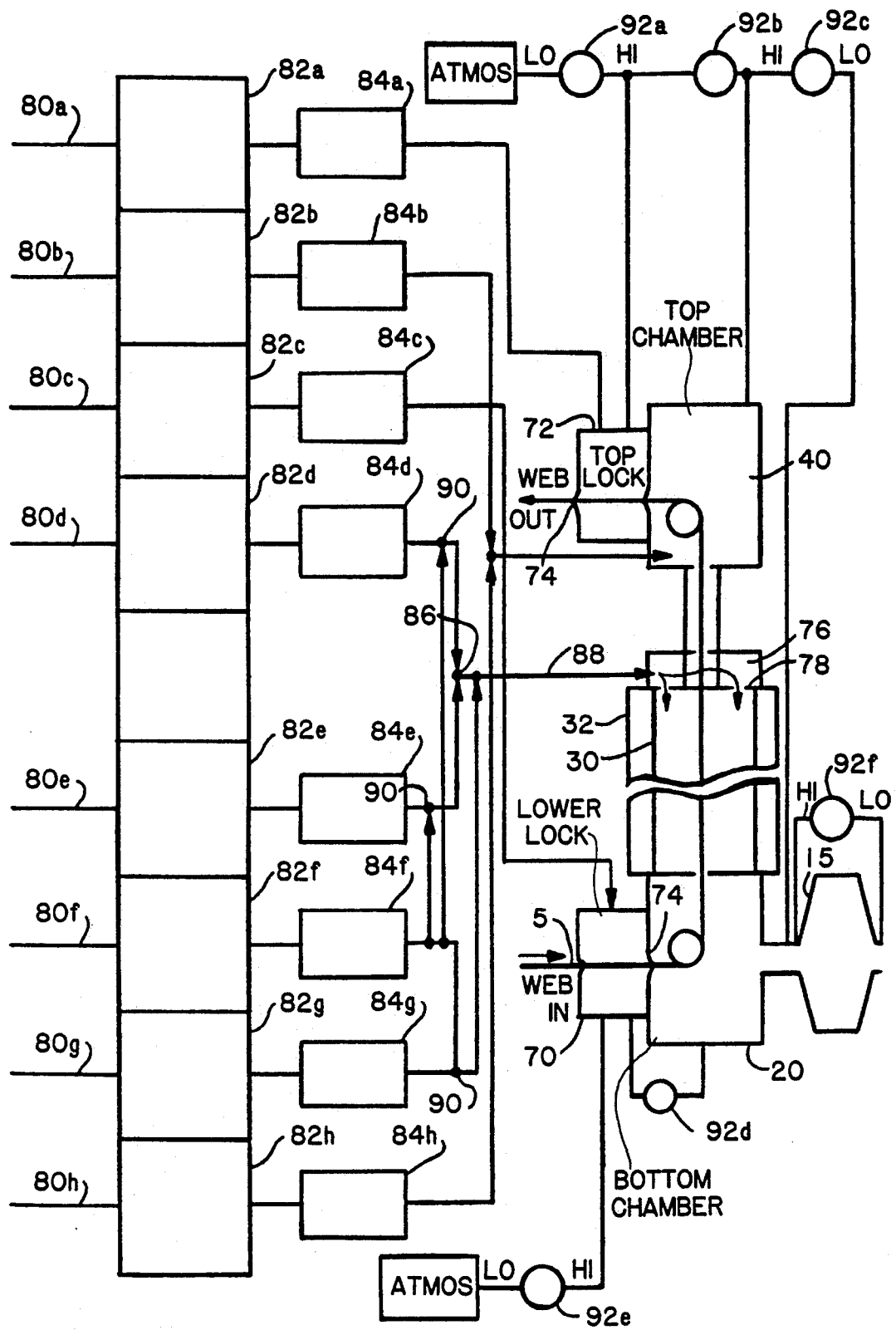
FIG. 5 is a schematic diagram of an embodiment of the system for pilot production.

FIG. 5 schematically shows a scale-up pilot production version of the present invention which has been fabricated and tested. The basic elements of the system including the bottom chamber 20, reaction chamber 30, oven 32 and upper chamber 40 remain as previously described. To enhance the "open" system nature of the invention, a lower lock 70 and an upper lock 72 have been added to the lower and upper chambers respectively. A positive pressure of inert gas is maintained in both locks to prevent air intrusion into the system. Wipers 74 allow the substrate web to enter and exit the lock without significant loss of pressure in the lock. The wipers may be fabricated from flexible rubber, teflon or other material not degraded by the process gases. A process gas inlet plenum 76 has been added between the top chamber and the reaction chamber to evenly distribute the entry of the process gas into the reaction chamber. Perforations in the interface 78 between the plenum and the reaction chamber allow gas to migrate into the reaction chamber. The plenum provides even distribution of the gas to both sides of the web to promote even coating of the substrate.

Control of gas flow rates in the system is accomplished by use of a Dynamass controller produced by Vacuum General Corporation. The Dynamass controller measures the mass flow rate of the gas measured and adjusts the flow rate to a desired value by way of a control valve. In the embodiment shown in FIG. 5, the inert gas blanket for the top lock (preferably argon or nitrogen) enters the Dynamass flowmeter on line 80a and is processed through the first channel of the Dynamass system 82a and control valve 84a to the top lock. A flow rate of 0 to 10,000 milliliters per minute is provided as will be described subsequently. Similarly the top chamber inert blanket is provided on line 80b through channel 82b of the Dynamass system and valve 84b. A flow rate of 0 to 10,000 milliliters per minute for the top chamber inert blanket is provided. The lower lock inert blanket is provided on input 80c through channel 82c of the Dynamass system and flow control valve 84c. 0 to 10,000 milliliters per minute of inert gas flow is provided. The basic process gas is provided on input 80d through the fourth channel 82d of the Dynamass system and flow control valve 84d. Flow capability of 0 to 10,000 milliliters per minute is provided. The doping process gas is provided on input 80e through channel 82e of the Dynamass system and flow control valve 84e. A flow rate of 0 to 1,000 milliliters per minute of the doping process gas is provided. The basic process gas and doping process gas are combined at node 86 to be introduced to the process gas inlet plenum through line 88. An inert purge is provided on line 80f through channel 82f of the Dynamass system and flow control valve 84f. The inert purge gas is provided at a set value of 4,000 milliliters per minute when activated as described subsequently. The inert purge is provided through connections 90 into each of the process gas lines and the air cooling line which will be subsequently described to allow purging and inerting of those lines. Cooling air is provided on input 80g through channel 82g of the Dynamass system and flow control valve 84g. Cooling air flow rate of 0 to 10,000 milliliters per minute is provided. Finally, a top chamber inert blanket booster of 0 to 10,000 milliliters per minute is provided on input 80h through channel 82h of the Dynamass system and flow control valve 84h to the top chamber. Those skilled in the art will recognize that the top chamber inert blanket and booster provided through channels 82b and 82h could be combined into a single channel with proper control sensitivity to provide desired flow rates.

Control of the speed of the substrate web through the system is provided by a motor control as previously described with respect to FIG. 4b.

Differential pressure indicators 92a through f are provided to sense the differential pressure between the top lock and atmospheric pressure (92a), the top lock and top chamber (92b), the top chamber and bottom chamber (92c), the bottom chamber and lower lock (92d), between the lower lock and atmospheric pressure (92e), and between the bottom chamber and outlet of the exhaust fan 15 (92f).

Operation of the system is accomplished in six basic sequences. An initial start cycle to turn the oven heaters on and purge the entire system with the inert purge gas initiates the process. A blanket sequence to stabilize the blanket pressures in the locks and top and bottom chambers is then completed. The system is allowed to stabilize for approximately 60 minutes prior to initiation of the process gas sequence which introduces the basic process gas and doping process gas into the reaction chamber. The system is again allowed to stabilize for approximately 60 minutes and a run start sequence is then employed to verify the temperatures in the reaction chamber and turn the web drive on causing the substrate to translate through the reaction chamber. The system is again allowed to stabilize for approximately 20 minutes at which time control of the speed of translation through the reaction chamber is initiated in a resistance bias speed control sequence. The system then operates to coat the substrate transitioning through the reaction chamber. If any of the process parameters are out of tolerance or if the coating operation is complete, a stop cycle is entered to deactivate the oven, stop flow of the process gases, and initiate a purge of the system. After purge of approximately 20 minutes is complete, cooling air is provided to cool down the reaction chamber.

Details of the process sequence previously described are shown in Table 1 and may be incorporated through a computer control system appropriately interfaced with the differential pressure indicators, Dynamass flow control system and the flow control valves. Pressure designations in Table 1 are P1 for atmospheric pressure, P2 for the pressure in the top lock, P3 for the pressure in the top chamber, P4 for the pressure in the bottom chamber, P5 for the pressure in the lower lock, and P6 for the pressure at the outlet of the exhaust fan.

TABLE 1

| START CYCLE 1 | ACTION/OBSERVATION | SETTING/VALUE | START TIME (MIN.) | DURATION |
|---|---|---|---|---|
| STEP 1.1 | Turn heater ON | 600–900° C. NOMINAL 0–1200° C. RANGE | 0 | CONTINUOUS |
| STEP 1.2 | Turn purge gas on (84f) | 4,000 ml/min NOMINAL 0–10,000 ml/min. range | 0 | 60 min. |
| If NO with 84h OFF, go to 1.3.6. If NO with 84h ON, go to 1.3.7. If YES, go to 1.4 at 60 minutes. | | | | |
| BLANKET SEQUENCE 1.3 | | | | |
| STEP 1.3.1 | Turn top chamber blanket gas ON (84b) | 9,000 ml/min NOMINAL 0–10,000 ml/min | 0 | Cont. |
| 1.3.2 | Turn fan ON under control of differential pressure (92c) BASIC P3 > P4 | +0.02 NOMINAL +0.01 to 0.04 in H20 | 1.0 | Cont. |
| 1.3.3 | Turn top lock blanket gas (VI) ON under control of DP gage (92a) P2 > P1, P3 > P2 | 0–10,000 ml/min +0.01 to 0.02 in H20 | 1.5 | Cont. |
| 1.3.4 | Turn lower lock blanket gas (84c) ON under control of DP gage (92e) P5 > P1, P5 > P4 | 0–10,000 ml/min. +0.01 to 0.02 in H20 | 1.5 | Cont. |
| 1.3.5 | Check DP relationships | +0.02 in H20 BASIC | 2. | |

TABLE 1-continued

| START CYCLE 1 | ACTION/OBSERVATION | SETTING/VALUE | START TIME (MIN.) | DURATION |
|---|---|---|---|---|
| | P3 > P4 | +0.01-0.02 in H20 | | |
| | P2 > P1 | +0.01-0.02 in H20 | | |
| | P5 > P1 | +0.01-0.02 in H20 | | |
| | P5 > P4 | | | |
| 1.3.6 | If P3 ≦ P4 turn top chamber booster blanket gas ON (84h) Go to 1.3.5 | 0-10,000 ml/min. | | 2.5 |
| 1.3.7 | Turn heater OFF | | | 3. |
| 1.3.8 | Turn all gas OFF | | | 3. |
| 1.3.9 | Sound alarm | | | 3. |
| PROCESS GAS SEQUENCE 1.4 | | | | |
| 1.4.1 | Heaters remain ON | | | 60 |
| 1.4.2 | Turn purge gas OFF (84f) | | | 60 |
| 1.4.3 | Turn process gas 1 ON (82d) ISOBUTYLENE | 0-10,000 ml/min. set value | | 60 |
| 1.4.4 | Turn process gas 2 ON (84e) BORON TRICHLORIDE | 0-1,000 ml/min. set value | | 60 |
| 1.4.5 | Resistance high, Resistance bias OFF (condition status) | | | 60 |
| 1.4.6 | Web drive OFF (condition status) | | | 60 |
| RUN START SEQUENCE 1.5 | | | | |
| 1.5.1 | Is Temp. at set point If YES, go to 1.5.2. If NO, repeat 1.5.1. | | | 120 min. minimum |
| 1.5.2 | Turn web drive ON at nominal speed | 6 inches/min. | | 120 min. |
| RESISTANCE BIAS SPEED CONTROL 1.6 | | | | |
| 1.6.1 | Resistance of web in range | ±10% of resistance in ohms/ square 1-10K OHM/SQ. | | 140 |
| 1.6.2 | Turn web drive resistance bias ON | +.0000 VDC to +0.2000 VDC inversely prop. to Res. | | 140 |
| STOP CYCLE 2. | | | | 0 min. of stop cycle |
| 2.1 | Is Resistance of web out of range? If YES, go to 2.7. | | | 0 |
| 2.2 | Is web drive motor torque too high or low? If YES, go to 2.7. | | | 0 |
| 2.3 | Are blanket gas relationships of 1.3.5 wrong? If YES, go to 2.7. | | | 0 |
| 2.4 | Are process gas flows of 1.4.3 and 1.4.4 wrong? If YES, go to 2.7. | | | 0 |
| 2.5 | Are set point temperatures of 1.5.1 wrong? If YES, go to 2.7. | | | 0 |
| 2.6 | Has operator initiated STOP CYCLE? If YES, go to 2.7. | | | 0 min of STOP CYCLE |
| 2.7 | Turn heaters OFF | | | 0 |
| 2.8 | Turn process gas 1 OFF (82d) | | | 0 |
| 2.9 | Turn process gas 2 OFF (84e) | | | 0 |
| 2.10 | Turn purge gas ON (84f) | 4,000 ml/min. | | 0 |
| 2.11 | Turn web drive OFF, return to operator control | | | 0 |
| 2.12 | Turn resistance bias OFF | | | 0 |
| 2.13 | Turn Air ON (84g) | 0-10,000 ml/min. | 20 | 120 min. 0-120 min. |

Figure 6:
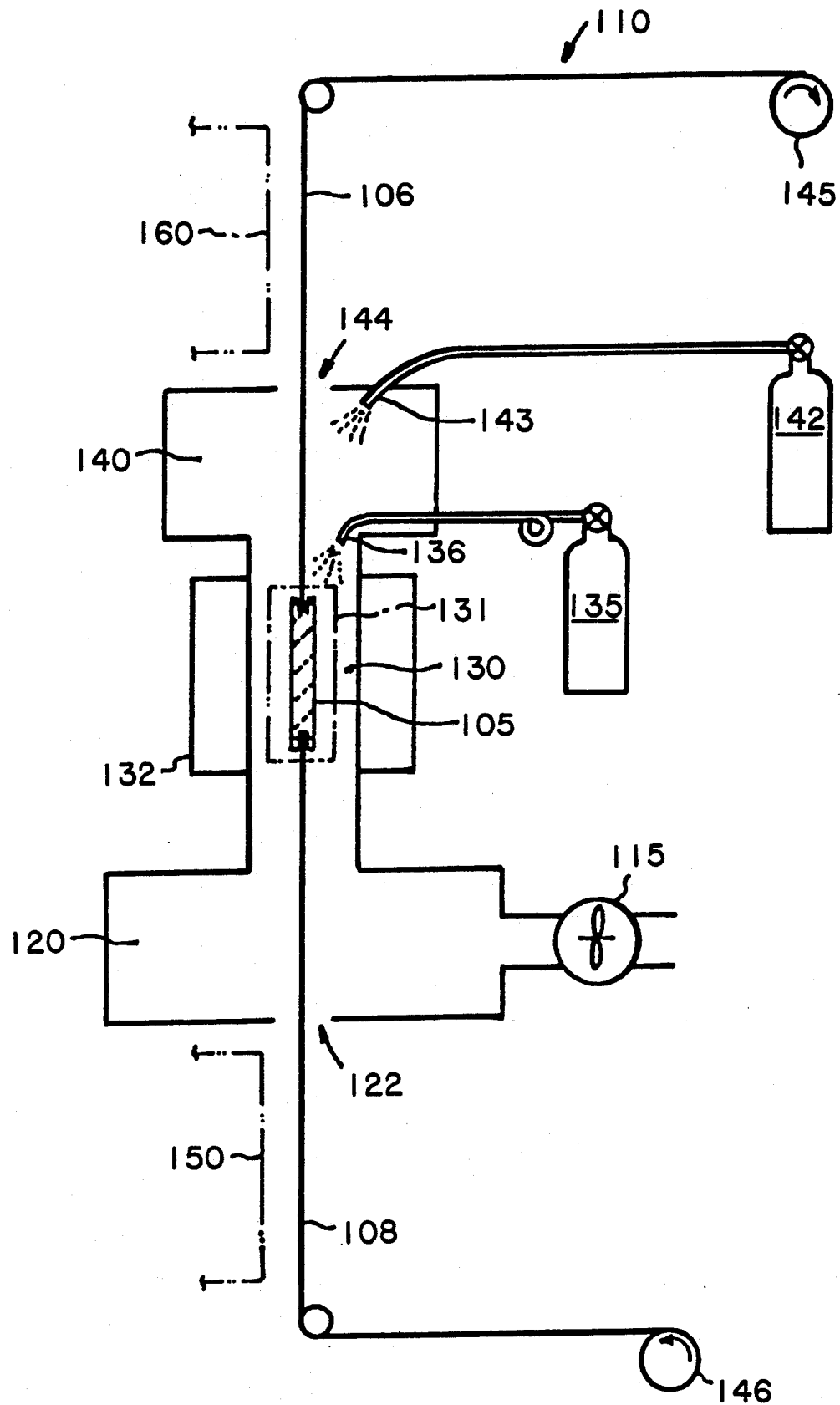
FIG. 6 is a schematic illustration of a process in accordance with an embodiment of the present invention for coating a porous refractory substrate.

The invention has heretofore been described in terms of coating a flexible, fibrous refractory substrate which is transported through the reaction chamber and stored on a spool or take-up means. In another embodiment, the invention may also be used to infiltrate dissociated precursor gas species throughout rigid, porous refractory substrates, such as tiles of boron oxide, to produce a uniform carbon or doped carbon coating which has particular electrical, magnetic, and optical properties on surfaces of pores and cavities of such materials In FIG. 6 is shown a schematic illustration of such an embodiment, with rigid porous refractory substrate 105 to be coated shown secured in coating position between upper substrate carrier 106 and lower substrate carrier 108 within reaction chamber 130 of vertically oriented process plant 110. Process plant 110 is appropriately mounted on a frame (not shown) secured to a base (not shown) of a workplace.

Process plant 110 is similar to process plant 10 described above, but with appropriate modifications to accommodate the insertion and removal of rigid porous refractory substrate 105 into and from the plant. Process plant 110 comprises a lower chamber 120, a heated reaction chamber 130 mounted atop and connected to the lower chamber 120, and an upper chamber 140 mounted atop and connected to the reaction chamber 130. The interiors of these chambers are, as before, preferably constructed of a strong, corrosion-resistant material, such as quartz.

Lower chamber 120 includes inlet aperture 122 at a lower surface of the lower chamber 120. Inlet aperture 122 is shown as a simple opening between lower chamber 120 and the ambient atmosphere. In other embodiments, inlet aperture 122 is equipped with a lock chamber and flexible wiper seal such as was described above with respect to the scaled-up pilot production embodiment of the present invention. The lock and wiper seal allow insertion of porous refractory substrate 105 into the process plant from below lower chamber 120, and also preclude entry of ambient air into the process plant 110 should fluctuations in the inert gas and precursor gas pressures cause the pressure in the process plant to decrease below ambient pressure. Normally, a slight overpressure (about 0.02" to 0.05" $H_2O$, or about 0.00005 to 0.0001 atmospheres) is maintained in the process plant 110 by flow of the inert and precursor gases to preclude entry of ambient air.

Lower chamber 120 is also shown as including exhaust means 115 attached thereto for removing the inert gas and by-products of the coating process, as was discussed above for coating fibrous refractory substrates. The inflow of the precursor and inert gases is balanced against outflow produced by the exhaust means to maintain the slight overpressure discussed above and to insure the downward flow of the precursor and inert gases through reaction chamber 130. The exhaust means 115 is adjusted as before to just remove the reaction by-products, with the coating process thereby operating essentially at atmospheric pressure.

Oven 132 preferably encompasses the entire reaction chamber 130 to provide a thermally uniform temperature environment within reaction chamber 130. As above, the preferred oven is a 54000 series tube furnace produced by Lindberg, 304 Hart Street, Watertown, Wis. Precursor gas 135 is introduced into the top of reaction chamber 132 through nozzle 136, with gravity operating to insure a downwardly flow of precursor gas 135 into reaction chamber 130 and, in turn, lower chamber 120. Precursor gas 135 is a hydrocarbon, with isobutylene being a preferred hydrocarbon.

Upper chamber 140 includes outlet aperture 144 at an upper surface of upper chamber 140. Outlet aperture 144 is shown as a simple opening between upper chamber 140 and the ambient atmosphere. In other embodiments, outlet aperture 144 is equipped with a lock chamber and flexible wiper seal as was discussed above with respect to inlet aperture 122. Such a flexible wiper seal allows for removal of coated porous substrate 105 from the upper chamber 140, while helping to prevent the entry of ambient air into process plant 110. Inert gas 142, preferably nitrogen or argon, is introduced into the upper chamber through nozzle 143 to facilitate the even distribution of precursor gas 135 throughout the chemical vapor deposition zone 131 of reaction chamber 130. In another embodiment, an additional flow of inert gas may be provided through a second nozzle (not shown) into upper chamber 140 with flow directed toward outlet aperture 144 to further preclude entry of ambient air into upper chamber 140.

A prototype process plant 110 in accordance with the present invention accommodates porous refractory substrates which are approximately 7/16" thick (the horizontal dimension of the substrate shown in FIG. 6), about 3½" to 4" wide (the dimension of the substrate normal to the plane of FIG. 6), and about 12" long (the vertical dimension of the substrate shown in FIG. 6). Inlet aperture 122 and outlet aperture 144 are sized to accommodate transport of substrates of such dimensions. A person skilled in the art will recognize that thicker, wider, and longer substrates may be coated by appropriate scaling up of such a prototype process plant to larger dimensions.

Upper and lower substrate carriers 106 and 108 each comprise a flexible, woven refractory cloth or tape material, but may be formed of any other flexible material which can withstand the elevated temperatures of the coating process (generally between 700°-900° C. but which can exceed 900° C. depending on the precursor gas or gases to be dissociated). One suitable substrate carrier is the fibrous substrate described above, i.e., Nextel 312 fabric. Upper and lower substrate carriers 106 and 108 are preferably of width approximately equal to the width of porous refractory substrate 105, but may in other embodiments be narrower or wider than the substrate.

Figure 7:
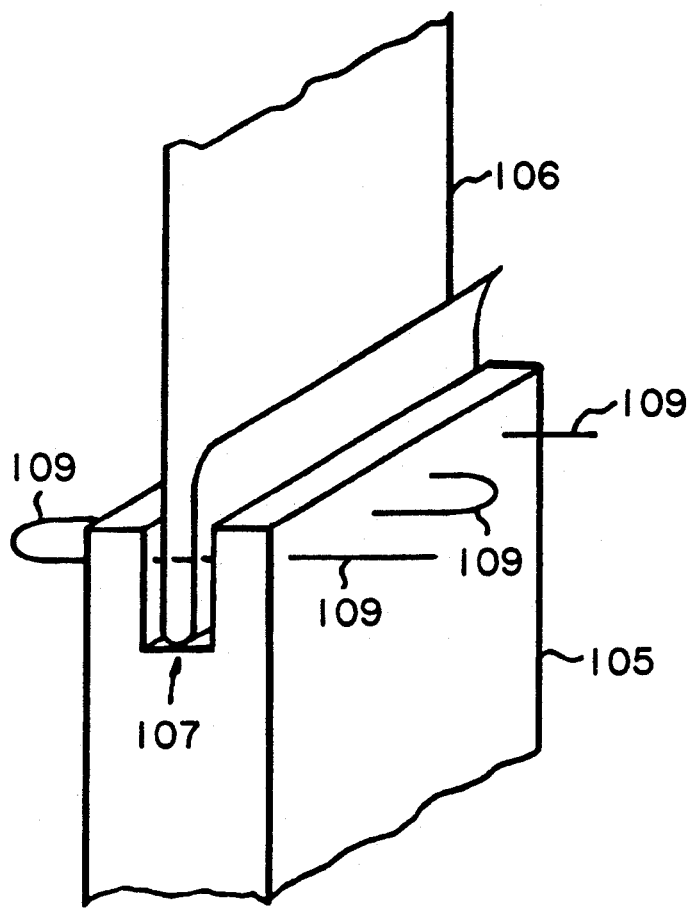
FIG. 7 is a perspective view showing a method of securing a rigid porous refractory substrate to a substrate carrier.

The porous refractory substrate 105 is secured to the upper and lower substrate carriers 106 and 108 as is shown in perspective for the upper portion of porous refractory substrate 105 in FIG. 7. That is, an end of each substrate carrier is doubled over itself for strength, inserted into a transverse slot or groove 107 formed in each opposing end of the porous refractory substrate 105, and sewn, stapled, or wired in place by stitching one or more lengths of a flexible fastening fiber 109 through the porous refractory substrate 105 and the substrate carrier. Suitable fastening fibers include nichrome wire and refractory yarns. It will be appreciated that other means of fastening the substrate carriers 106 and 108 to the porous refractory substrate 105 will be evident to persons skilled in the art, with such alternate fastening methods being within the contemplated scope of the present invention.

Returning to FIG. 6, it will be seen that upper substrate carrier 106 extends upwardly from porous refractory substrate 105 through upper chamber 140 and outlet aperture 144 to take-up means 145. Lower substrate carrier 108 extends downwardly from porous refractory substrate 105 through lower chamber 120 and inlet aperture 122 to playout means 146.

To coat porous refractory substrate 105, upper substrate carrier 106 is unwound from take-up means 145 and passed downwardly through outlet aperture 144, upper chamber 140, reaction chamber 130, lower chamber 120, and inlet aperture 120 to loading position 150 beneath process plant 110. Upper substrate carrier 106 and lower substrate carrier 108 are then secured to porous refractory substrate 105 in the manner discussed above or in any other suitable manner.

Reaction chamber 130 is heated and process plant 110 is purged by flushing inert gas 142 through process plant 110 in the manner discussed above for process plant 10. When the purging operation is complete and reaction chamber 130 has been heated to the required dissociation temperature, upper substrate carrier 106 is wound onto take-up means 145 to introduce porous refractory substrate 105 into the lower chamber 120 through inlet aperture 122 and to transport porous refractory substrate 105 up into reaction chamber 130 and through process plant 110 to unloading position 160. As upper substrate carrier 106 is wound onto take-up means 145, lower substrate carrier 108 is unwound from playout means 146 to allow upward motion of porous refractory substrate 105 into and through the process plant 110. The unwinding of lower substrate carrier 108 from playout means 146 is controlled to maintain a slight tension in both upper substrate carrier 106 and lower substrate carrier 108 so that porous refractory substrate 105 is maintained in a substantially vertical orientation during transport into and through process plant 110.

Typical transport rates for porous substrate carriers are from about 1" to 3" per minute. Those skilled in the art will appreciate that faster or slower rates may be employed, and that the properties of the coated substrate are dependent upon the transport rate. Electrical conductivity, for example, is increased as the transport rate is decreased.

Chemical vapor infiltration of porous refractory substrate 105 is accomplished by introducing precursor gas 135 into the upper region of the reaction chamber 130 through nozzle 136. Gravity forces and the slightly higher pressure in the upper chamber relative to the lower chamber 120, created by the introduction of inert gas 142 into upper chamber 140, cause precursor gas 135 to flow downwardly through process plant 110 counter-current to the upward motion of porous refractory substrate 105. As precursor gas 135 flows downwardly through the heated reaction chamber 130, it is thermally dissociated into various species of individual atoms and molecular fragments. These species infiltrate the cavities and pores of upwardly moving porous refractory substrate 105 and collide with and condense on surfaces of such cavities and pores to deposit thereon a uniform superstrate coating having particular electrical, mechanical, and optical properties.

During the deposition process, a flow of inert gas 142 is maintained into upper chamber 140 to facilitate the even distribution of precursor gas 135 and its pyrolytically dissociated species within chemical vapor deposition zone 131 and to maintain the slight overpressure discussed above. The even distribution of the precursor gas 135 and the species dissociated therefrom insures that surfaces of the pores and cavities of porous refractory substrate 105 encounter uniform conditions for the deposition of superstrate material. Although precursor gas and dissociated species concentrations may differ from upper regions to lower regions of deposition zone 131, the constant flow of precursor gas 135 and inert gas 142 insures that essentially constant concentrations of dissociated species are maintained at any given horizontal stratum of deposition zone 131. Consequently, as porous refractory substrate 105 is transported upwardly through reaction chamber 130 and infiltration zone 131, all pores and cavities of the substrate are cumulatively exposed to substantially the same profile of species concentration so that the superstrate produced on and within porous refractory substrate 105 is of substantially uniform composition and physical-chemical properties along its length.

Upper substrate carrier 106 is continuously wound onto take-up means 145 until porous refractory substrate 105 has been transported through process plant 110 to unloading position 160 above process plant 110. Coated porous refractory substrate 105 is then separated from upper and lower substrate carriers 106 and 108 and further processed for use. Such processing includes the forming of coated porous refractory substrate 105 into one or more shaped tiles or plates.

It will be appreciated that process plant 110, take-up means 145, and playout means 146 are mounted on a frame (not shown) such that adequate clearance distance is maintained below lower chamber 120 to allow porous refractory substrate 105 to be secured to upper and lower substrate carriers 106 and 108 at loading position 150 and positioned vertically for upward transport through process plant 110. It will also be appreciated that process plant 110 is mounted on the frame such that adequate clearance distance is maintained above upper chamber 140 to allow coated porous refractory substrate 105 to be separated from upper and lower substrate carriers 106 and 108 at unloading position 160 for further processing.

The pyrolytic process in process plant 110 is as described above for process plant 10. The nature of the dissociated species and the superstrate produced depend upon a number of factors as has been previously enumerated.

A second precursor gas, such as boron trichloride, may be employed in the manner previously discussed for process plant 10 to produce a boron-doped carbon superstrate on porous refractory substrate 105. Electrical properties of the coated porous refractory substrate 105 can be controlled as previously discussed by adjusting the hydrocarbon/boron ratio of the precursor gases. A feedback control system as described for process plant 10 can be used to "fine tune" the electrical properties of the coated porous refractory substrate 105. And, the present invention may be incorporated into a production version of process plant 110 as has been heretofore discussed for process plant 10, wherein a plenum added to upper chamber 140 more evenly distributes precursor gas 135 to all sides of porous refractory substrate 105 as described earlier, and wherein gas flow rates are controlled by a controller to adjust flow rates to desired values by way of control valves and a manifold. The plenum is suitably perforated to allow the gas to migrate into reaction chamber 130 and flow downwardly around all four vertically-oriented surfaces of porous refractory substrate 105, and is suitably provided with a central aperture through which upper substrate carrier 106, porous refractory substrate 105, and lower substrate carrier 108 may be transported.

A plurality of rigid porous refractory substrates may also be coated in accordance with the present invention. In such an embodiment, an end of the first porous refractory substrate to be coated is secured to the upper substrate carrier, and an end of the last porous refractory substrate to be coated is secured to the lower substrate carrier, in the manner discussed above. These substrates, and any additional porous refractory substrates to be coated, are secured to each other by intermediate substrate carriers, and sequentially drawn through the process plant by winding the upper substrate carrier onto the take-up means to provide a continuous throughput of coated porous refractory substrates.

Figure 8:
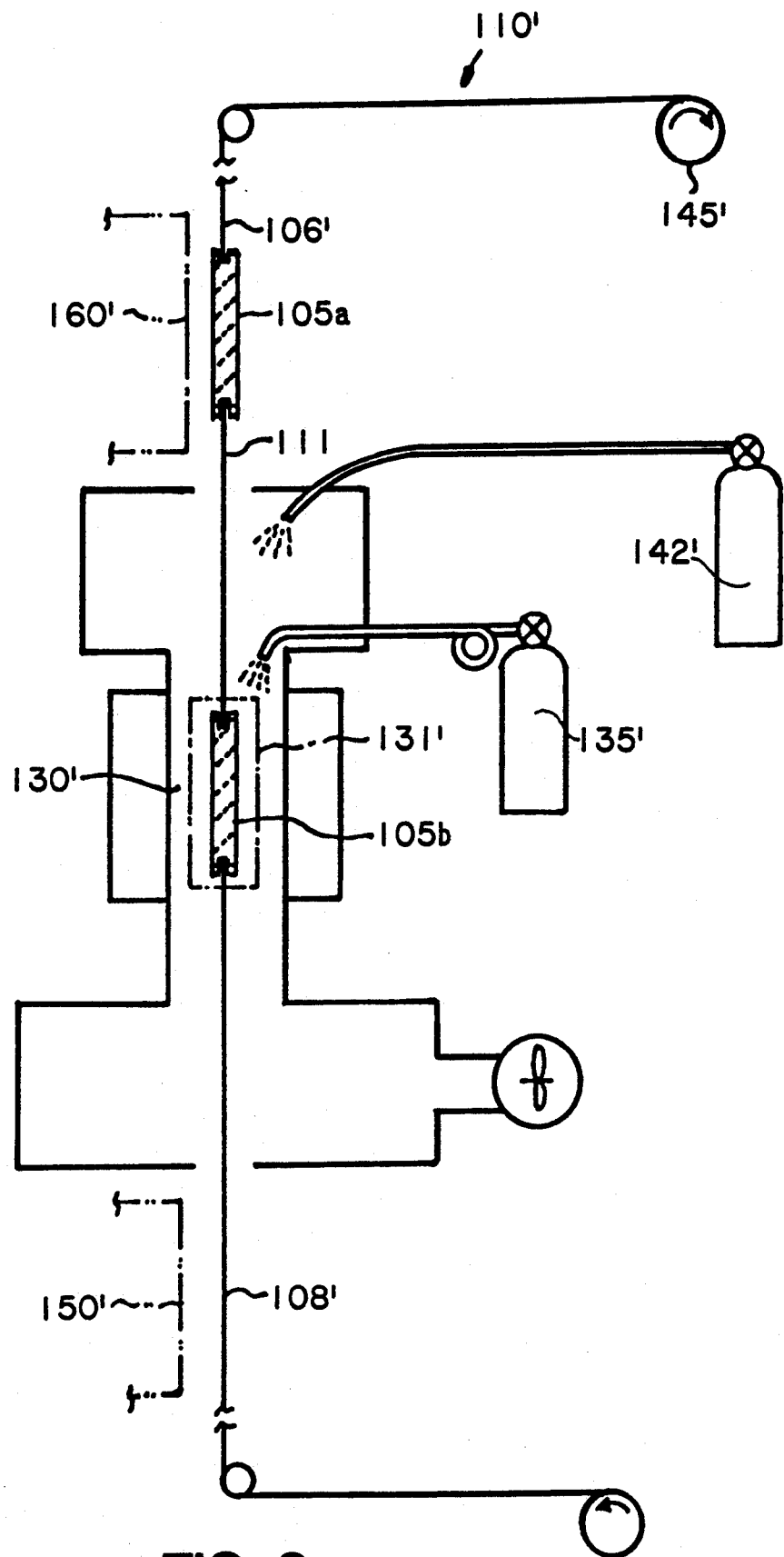
FIG. 8 is a schematic illustration of a process in accordance with an embodiment of the present invention for coating a plurality of rigid porous refractory substrates.

Such an embodiment is shown in FIG. 8. In FIG. 8, process plant 110' is configured to coat a sequence of two porous refractory substrates. First porous refractory substrate 105a is shown at unloading position 160' after having been coated, and second porous refractory substrate 105b is shown being coated in deposition zone 131' of reaction chamber 130' of process plant 110'. First porous refractory substrate 105a is shown connected to second porous refractory substrate 105b by intermediate substrate carrier 111 in the manner discussed above. To coat multiple porous refractory substrates, upper substrate carrier 106' is inserted through process plant 110' as has been previously described. First and second porous refractory substrates 105a and 105b are secured to upper and lower substrate carriers 106' and 108', respectively, and to intermediate substrate carrier 111, at loading position 150' below process plant 110'. Process plant 110' is purged by inert gas 142', reaction chamber 130' is heated to the selected dissociation temperature and precursor gas 135' is introduced into reaction chamber 130' as was discussed for process plant 110. Winding upper substrate carrier 106 onto take-up means 145' successively transports first porous refractory substrate 105a, intermediate substrate carrier 111, and second porous refractory substrate 105b through process plant 110' to unloading position 160', where the coated substrates are separated from the substrate carriers for further processing. The porous refractory substrates are coated as has previously been discussed by condensation of species of the dissociated precursor gas 135' on surfaces of pores and cavities of each porous refractory substrate as the substrate is transported upwardly through chemical vapor deposition zone 131'.

It will be appreciated that the number and the lengths of substrates which can be coated in the "continuous throughput" manner described above is limited by the vertical clearance above and below the process plant 110', but that increasing such clearances where feasible will enable the coating of a plurality of porous refractory substrates, or of porous refractory substrates of substantial length. In an alternative embodiment, conveyor means may be employed to more compactly position coated and uncoated substrates above and below the process plant in workplaces where vertical clearance is limited.

It will be understood by those skilled in the art that the present invention can be utilized to coat a rigid porous refractory substrate with other materials. Because the process entails pyrolytic dissociation, correlation between precursor gas bond strengths and reaction chamber temperature is required.

The invention has been described in exemplary and preferred embodiments, but it is not limited thereto. Those skilled in the art will recognize that a number of additional modifications and improvements can be made to the invention without departure from the essential spirit and scope. Therefore, the invention is not limited by the above disclosure, but only by the following claims.

What is claimed is:

1. A process for coating a porous refractory substrate, comprising the steps of:
    moving the porous refractory substrate, leading end followed by trailing end, in a generally vertical upward direction along a substrate path extending through a lower chamber open to atmospheric pressure and having an inlet aperture for introducing the porous refractory substrate into the lower chamber, and then through a generally vertically oriented reaction chamber mounted atop and extending upwardly away from the lower chamber, and then through an upper chamber mounted atop and extending away from the reaction chamber, the upper chamber being open to atmospheric pressure and having an outlet aperture for withdrawing the porous refractory substrate from the upper chamber, and finally to an unloading position external to and above the upper chamber;
    introducing a first precursor gas into the reaction chamber and directing the first precursor gas evenly toward the porous refractory substrate in a first direction generally opposite to the upward movement of the porous refractory substrate along the substrate path; and,
    heating the reaction chamber to a temperature sufficient to pyrolytically dissociate the first precursor gas into a plurality of first species such as individual atoms and molecular fragments, certain of the first species infiltrating pores and cavities of the porous refractory substrate and colliding with and evenly condensing upon surfaces of the pores and cavities of the porous refractory substrate as the porous refractory substrate is moved through the reaction chamber, whereby a superstrate coating is formed on the porous refractory substrate.

2. A process as claimed in claim 1, further comprising:
    introducing a second precursor gas into the reaction chamber and directing the second precursor gas evenly toward the porous refractory substrate in a second direction generally opposite to the movement of the porous refractory substrate along the substrate path, the temperature of the reaction chamber being selected to pyrolytically dissociate both the first and second precursor gases, the second precursor gas dissociating into various second species such as individual atoms and molecular fragments, certain of the second species infiltrating the pores and cavities of the porous refractory substrate and colliding with and evenly condensing on the surfaces of the pores and cavities along with the condensing certain of the first species as the porous refractory substrate is moved through the reaction chamber, whereby a doped superstrate coating is formed on the porous refractory substrate.

3. A process as claimed in claim 1, further comprising introducing an inert gas into the upper chamber, the inert gas flowing downwardly from the upper chamber through the reaction chamber and into the lower chamber, a flow rate of the inert gas being selected to preclude entry of air into the upper chamber, the reaction chamber, and the lower chamber.

4. A process as claimed in claim 3, wherein the inert gas comprises nitrogen.

5. A process as claimed in claim 3, wherein the inert gas comprises argon.

6. A process as claimed in claim 1, wherein an oven encompasses the reaction chamber, operation of the oven producing thermally uniform conditions within the reaction chamber.

7. A process as claimed in claim 1, wherein the first precursor gas comprises a hydrocarbon selected from the group consisting of methane, ethane, propane, butane, isobutylene and mixtures thereof.

8. A process as claimed in claim 2, wherein the second precursor gas is selected from the group consisting of boron trichloride, boron tribromide, and diborane.

9. A process as claimed in claim 1, further comprising:
    measuring a physical property of the coated porous refractory substrate relative to a predetermined desired value; and,
    selectively controlling a rate of flow of the first precursor gas, a transport velocity of the substrate movement, and the temperature of the reaction chamber in response to the measured physical property to control a rate of deposition of the certain of the first species upon the surfaces of the pores and cavities of the porous refractory substrate, the coated porous refractory substrate having a controlled resistance along its length and a substantially uniform resistance along its breadth.

10. A process as claimed in claim 1, wherein the condensed first species comprises an electrically conductive superstrate coating.

11. A process as claimed in claim 2, wherein both the condensed first species and the condensed second species comprise an electrically conductive superstrate coating.

12. A process as claimed in claim 2, further comprising:

measuring a physical property of the coated porous refractory substrate relative to a predetermined desired value; and, selectively controlling a first rate of flow of the first precursor gas, a second rate of flow of the second precursor gas, a transport velocity of the movement of the porous refractory substrate, and the temperature of the reaction chamber in response to the measured physical property to control a rate of deposition of the certain of the first species and the certain of the second species upon the surfaces of the pores and cavities of the porous refractory substrate, the coated porous refractory substrate having a controlled resistance along its length and a substantially uniform resistance along its breadth.

13. A process as claimed in claim 1 wherein the inlet and outlet apertures are each equipped with a lock chamber and a wiper seal.

14. A process for chemical vapor deposition of a superstrate coating onto a porous refractory substrate, comprising the steps of:

introducing the porous refractory substrate, leading end followed by trailing end in a generally vertical direction, along a substrate path extending through a lower chamber open to atmospheric pressure and having an inlet aperture for introducing the porous refractory substrate into the lower chamber, and then upwardly through a generally vertically oriented reaction chamber mounted atop and extending upwardly from the lower chamber, and then into an upper chamber open to atmospheric pressure mounted atop and extending upwardly away from the reaction chamber and having an outlet aperture for withdrawing the porous refractory substrate from the upper chamber, and finally to an unloading position external to and above the upper chamber;

introducing an inert gas into the upper chamber at a rate sufficient to prevent air from entering the upper chamber, the inert gas flowing downwardly through the reaction chamber and the lower chamber and preventing air from entering the reaction and lower chambers;

introducing at least one precursor gas into the reaction chamber and directing the precursor gas evenly toward the porous refractory substrate in a downward direction generally opposite to the movement of the porous refractory substrate along the substrate path;

heating the reaction chamber to a temperature sufficient to pyrolytically dissociate the precursor gas into a plurality of species such as individual atoms and molecular fragments, certain of the species colliding with and evenly condensing on surfaces of pores and cavities of the upwardly moving porous refractory substrate as the porous refractory substrate is moved through the reaction chamber, whereby the superstrate coating is formed on the porous refractory substrate;

measuring a physical property of the coated porous refractory substrate relative to a predetermined desired value;

selectively controlling a rate of flow of the precursor gas, a transport velocity of the porous refractory substrate, and the temperature of the reaction chamber in response to the measured physical property to control a rate of deposition of the certain of the species upon the surfaces of the pores and cavities of the porous refractory substrate; ad withdrawing the coated porous refractory substrate from the upper chamber, whereby the deposition process is accomplished in an open system and substantially at atmospheric pressure.

15. A process as claimed in claim 14, wherein the precursor gas is selected from the group consisting of hydrocarbons and main group halides.

16. A process as claimed in claim 14, wherein the deposited species form an electrically conductive superstrate.

17. A process as claimed in claim 14, wherein an oven encompasses the reaction chamber, whereby thermally uniform conditions are produced within the reaction chamber upon operation of the oven.

18. A process for coating a porous refractory substrate, comprising the steps of:

extending an upper substrate carrier from a take-up means along a substrate path extending in a generally downward direction from the take-up means through an upper chamber open to atmospheric pressure and having an outlet aperture in an upper surface for passage of the upper substrate carrier therethrough, and then through a generally vertically oriented reaction chamber mounted beneath and extending downwardly from the upper chamber, and then through a lower chamber open to atmospheric pressure mounted beneath and extending downwardly from the reaction chamber and having an inlet aperture in a lower surface for passage of the upper substrate carrier therethrough, and finally to a loading position external to and below the lower chamber;

securing the porous refractory substrate tot he upper substrate carrier and to a lower substrate carrier extending from a playout means at the loading position;

introducing an inert gas into the upper chamber, the inert gas flowing downwardly from the upper chamber through the reaction chamber and the lower chamber, a flow rate of the inert gas being selected to purge the upper, reaction, and lower chambers of oxygen and to preclude the entry of ambient air into the upper, reaction, and lower chambers;

introducing a first precursor gas into the reaction chamber and directing the first precursor gas evenly in a first downward direction along the substrate path;

heating the reaction chamber to a temperature sufficient to pyrolytically dissociate the precursor gas into a plurality of first species such as individual atoms and molecular fragments; and, winding the upper substrate carrier into the take-up means, whereby the porous refractory substrate is transported in an upward direction along the substrate path from the loading position through the inlet aperture, and then through the lower chamber, and then through the reaction chamber, and then through the upper chamber, and then through the outlet aperture, and finally to an unloading position external to and above the upper chamber, certain of the first species infiltrating pores and cavities of the porous refractory substrate and colliding with and condensing upon surfaces of the pores and cavities as the porous refractory substrate is transported through the reaction chamber, whereby a superstrate coating having particular electrical, mechanical, and optical properties is formed on the surfaces of the pores and cavities of the porous refractory substrate.

19. A process as claimed in claim 18, further comprising a step of:

introducing a second precursor gas into the reaction chamber and directing the second precursor gas evenly in a second downward direction along the substrate path, the temperature of the reaction chamber being selected to pyrolytically dissociate the first and second precursor gases, the second precursor gas dissociating into a plurality of second species such as individual atoms and molecular fragments, certain of the second species infiltrating the pores and cavities of the porous refractory substrate and colliding with and condensing upon the surfaces of the pores and cavities along with the condensing certain of the first species as the porous refractory substrate is transported through the reaction chamber, whereby a doped superstrate coating having particular electrical, mechanical, and optical properties is formed on the surfaces of the pores and cavities of the porous refractory substrate.

20. A process as claimed in claim 17 wherein the inlet and outlet apertures are each equipped with a lock chamber and a wiper seal.

* * * * *